(12) United States Patent
Yu

(10) Patent No.: US 7,033,846 B2
(45) Date of Patent: Apr. 25, 2006

(54) METHOD FOR MANUFACTURING SEMICONDUCTOR DEVICES BY MONITORING NITROGEN BEARING SPECIES IN GATE OXIDE LAYER

(75) Inventor: Chih-Hsing Yu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/796,614

(22) Filed: Mar. 8, 2004

(65) Prior Publication Data
US 2005/0032251 A1 Feb. 10, 2005

(30) Foreign Application Priority Data
Aug. 6, 2003 (CN) .............................. 03142094.X

(51) Int. Cl.
*G01R 31/26* (2006.01)
*H01L 21/31* (2006.01)
(52) U.S. Cl. ........................... 438/14; 438/18; 438/775
(58) Field of Classification Search ................. 438/14, 438/18, 770, 775, 778
See application file for complete search history.

(56) References Cited

U.S. PATENT DOCUMENTS
2004/0235203 A1 * 11/2004 Gurba et al. .................... 438/8

* cited by examiner

*Primary Examiner*—Hsien-Ming Lee
(74) *Attorney, Agent, or Firm*—Townsend and Townsend and Crew LLP

(57) ABSTRACT

A method for processing integrated circuit devices. The method includes introducing a test wafer into a production run of wafers to form a run of wafers to be processed. Each of the wafers is before a gate dielectric production process. The method inserts the run of wafers into a process for gate dielectric production, e.g., gate oxide. The method forms a silicon oxynitride layer to a predetermined thickness of less than 30 Angstroms at a predetermined temperature using a nitrogen bearing species and an oxygen bearing species, alone or in combination. The method removes the test wafer from the run and forms a second oxidation overlying the silicon oxynitride layer to a second thickness, which is based substantially upon a nitrogen bearing concentration in the silicon oxynitride layer. The method determines a difference value between the first predetermined thickness and the second thickness. A step of correlating the difference value to one of a plurality of nitrogen concentrations to determine a nitrogen concentration in the first predetermined thickness is included.

20 Claims, 5 Drawing Sheets

METHOD FOR MANUFACTURING SEMICONDUCTOR DEVICES BY MONITORING NITROGEN BEARING SPECIES IN GATE OXIDE LAYER

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention is directed integrated circuits and their processing for the manufacture of semiconductor devices. More particularly, the invention provides a method for forming a gate oxide having a nitrogen bearing species (this invention do not specify any method to form a nitrodized gate oxide, only focus on how to monitor this kind of process) and monitoring a concentration of the nitrogen bearing species to form thin gate dielectric layers for MOS device structures for logic devices. But it would be recognized that the invention has a much broader range of applicability. For example, the invention can be applied to a variety of devices such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to prevent impurities from diffusing from a gate region of a device through a gate dielectric to an underlying channel region, which limits the reliability of the transistor device.

As merely an example, dopant impurities migrating from the gate region into the channel region negatively influence operation of the transistor device. Boron impurities often used to dope the gate region are small in size and are able to move about from the gate region. Such boron impurities often migrate from the gate structure, including the gate polysilicon layer, through the gate oxide layer into the channel region. Since the boron impurities are charged species, they often influence a threshold voltage of the transistor device. The threshold voltage often shifts. Other limitations include high charge trapping rates, degradation of P-type channel inverse sub-threshold voltage, poor reliability of the transistor device, and the like.

From the above, it is seen that an improved technique for processing semiconductor devices is desired.

BRIEF SUMMARY OF THE INVENTION

The present invention is directed integrated circuits and their processing for the manufacture of semiconductor devices. More particularly, the invention provides a method (the method mentioned is a well known process, not provided by this invention)for forming a gate oxide having a nitrogen bearing species and monitoring a concentration of the nitrogen bearing species to form thin gate dielectric layers for MOS device structures for Logic devices. But it would be recognized that the invention has a much broader range of applicability. For example, the invention can be applied to a variety of devices such as static random access memory devices (SRAM), application specific integrated circuit devices (ASIC), microprocessors and micro controllers, Flash memory devices, and others.

In a specific embodiment, the invention provides a method for processing integrated circuit devices. The method includes introducing a test wafer into a production run of wafers to form a run of wafers to be processed. Each of the wafers is before a gate dielectric production process. The method inserts the run of wafers into a process for gate dielectric production, e.g., gate oxide. The method forms a silicon oxynitride layer to a predetermined thickness of less than 30 Angstroms at a predetermined temperature using a nitrogen bearing species and an oxygen bearing species, alone or in combination. The method removes the test wafer from the run and forms a second oxidation overlying the silicon oxynitride layer to a second thickness, which is based substantially upon a nitrogen bearing concentration in the silicon oxynitride layer. The method determines a difference value between the first predetermined thickness and the second thickness. A step of correlating the difference value to one of a plurality of nitrogen concentrations to determine a nitrogen concentration in the first predetermined thickness is included.

In an alternative specific embodiment, the invention provides a method for processing integrated circuit Logic devices. The method includes preparing a plurality of test wafers identifiable by numbers from 1 through N, where N is an integer greater than 1. Each of the test wafers includes a predetermined thickness of dielectric material overlying the test wafer. The predetermined thickness of dielectric material is substantially a same thickness for each of the test wafers. The method includes introducing a predetermined concentration of nitrogen bearing impurity from a plurality of different concentrations identifiable by numbers from 1 through N, where N is an integer greater than 1, into a respective test wafer identifiable by numbers 1 through N.

The method repeats the introducing for other test wafers numbered from 1 through N until predetermined concentrations numbered from 1 through N are respectively introduced into test wafers numbered from 1 through N. The method subjects each of the test wafers to an oxidizing environment under selected conditions to cause growth to the dielectric layer on each of the test wafers. The growth is based for each test wafer based upon the predetermined concentration of nitrogen bearing impurity in the test wafer. The method measures a thickness of the dielectric material for each of the test wafers 1 through N. The thickness of the dielectric material for each of the test wafers is identifiable by numbers from 1 through N. The method correlates each of thickness numbered from 1 through N to each respective predetermined concentration numbered from 1 through N.

Many benefits are achieved by way of the present invention over conventional techniques. For example, the present technique provides an easy way to monitor process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed integrated circuits and their processing for the manufacture of semiconductor devices. More particularly, the invention provides a method for forming a gate oxide having a nitrogen bearing species and monitoring a concentration of the nitrogen bearing species to form thin gate dielectric layers for MOS device structures for Logic devices. But it would be recognized that the invention has a much broader range of applicability. For example, the invention can be applied to a variety of devices such as static random access memory devices (SRAM), application specific integrated circuit devices (ASIC), microprocessors and micro controllers, Flash memory devices, and others.

Figure 1:
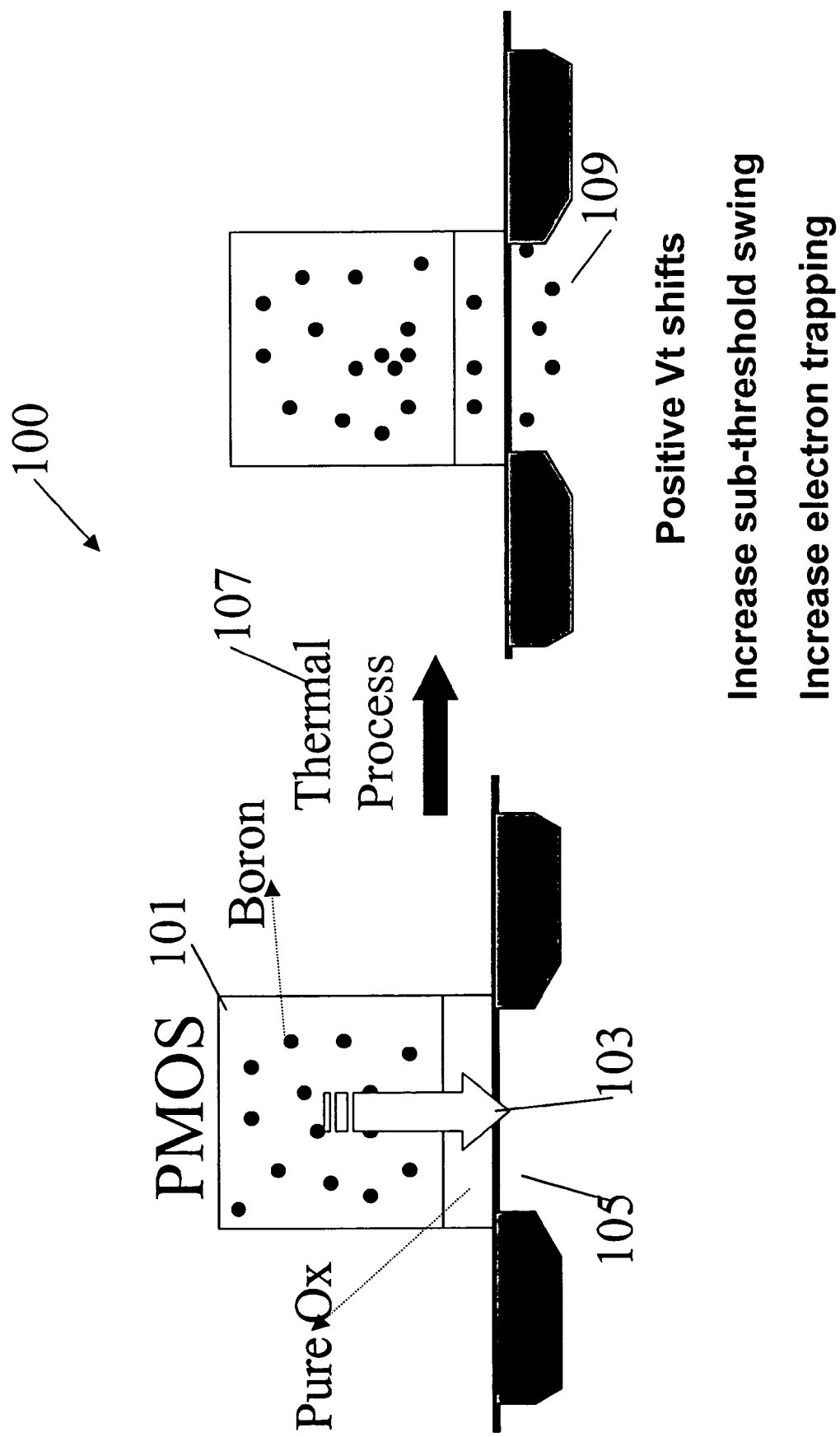
FIG. 1 is a simplified cross-sectional view of a semiconductor deviceaccording to an embodiment of the present invention.

FIG. 1 is a simplified cross-sectional view diagram 100 of a semiconductor device according to an embodiment of the present invention. This diagram is merely an example, which should not unduly limit the scope of the claims herein. One of ordinary skill in the art would recognize many other variations, modifications, and alternatives. As shown, the diagram 100 includes a variety of features including gate structure 101, which includes boron-bearing impurities, coupled between source/drain regions to define a MOS transistor structure. The boron bearing impurities diffuse from the gate region through a gate oxide layer and into a channel region, which underlies the gate region. Such diffusion often occurs during a subsequent thermal process 107. Boron bearing impurities are often small in size and accumulate in the channel region 109. Many limitations exist with such boron impurities in the channel region. These limitations include positive threshold voltage shifts, an increase in sub-threshold swing, and an increase in electron trapping, among many reliability issues. Accordingly, certain techniques have been developed to possibly reduce or even eliminate the presence of boron in the channel region. These techniques are described throughout the present specification and more particularly below.

Figure 2:
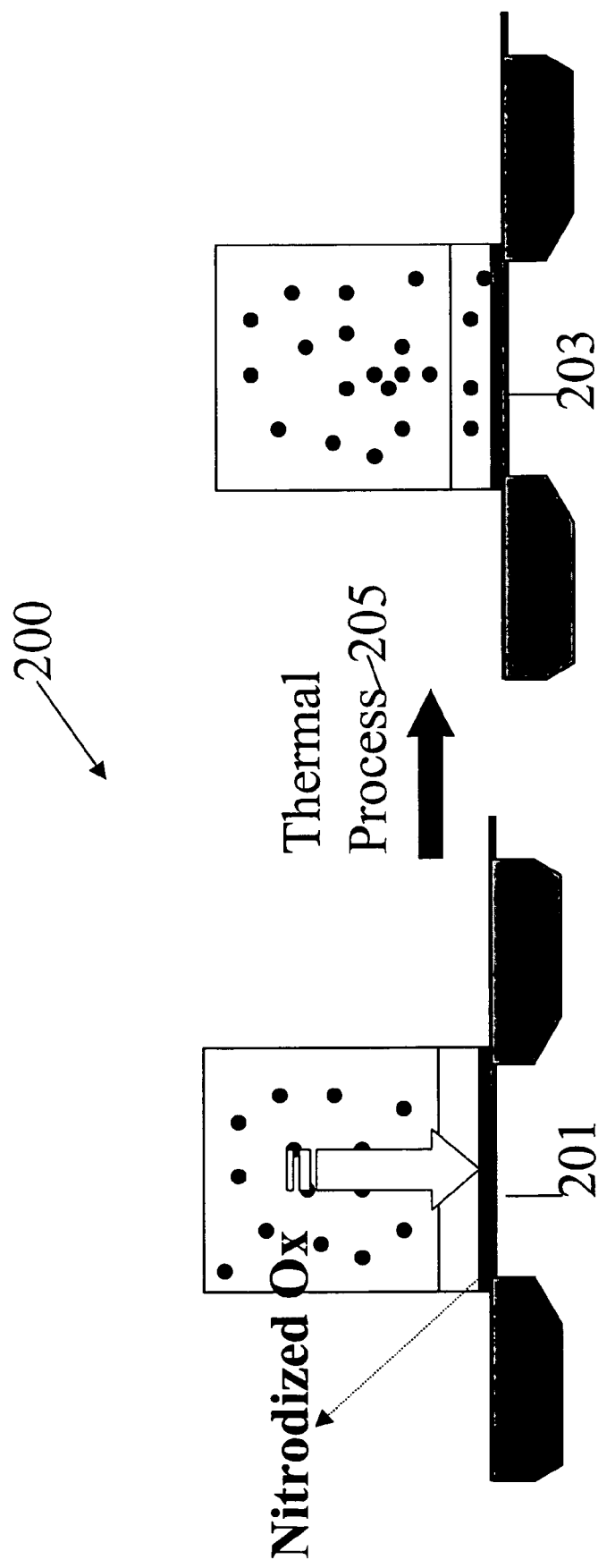
FIG. 2 is a simplified cross-sectional view of a semiconductor device according to an alternative embodiment of the present invention.

FIG. 2 is a simplified cross-sectional view diagram 200 of a semiconductor device according to an alternative embodiment of the present invention. This diagram is merely an example, which should not unduly limit the scope of the claims herein. One of ordinary skill in the art would recognize many other variations, modifications, and alternatives. As shown, techniques include forming a silicon oxynitride layer 201 underlying the gate structure. The nitrogen atoms introduced in gate dielectric can block the penetration of boron impurities into the channel region. Accordingly, boron impurities are maintained in the gate region 203 and are substantially free in the channel region, which underlies the gate region. Unfortunately, it is often difficult to control the amount of nitrogen bearing impurities in the silicon oxynitride layer. That is, impurity concentrations are often difficult to measure and can only be done so with off-line monitoring techniques. Such techniques include SIMS analysis, which is burdensome and cumbersome. Additionally, such layers cannot be measured in thickness with any reasonable degree of accuracy when they are so thin in conventional gate dielectric layer structures. Accordingly, a technique has been developed to monitor the concentration of the nitrogen bearing impurity using the following methods as described below.

A method according to an embodiment of the present invention for monitoring a concentration of nitrogen bearing impurities in the gate dielectric layer can be provided as follows:

1. Provide test semiconductor substrate with production run of production wafers or without production wafers;

2. Form oxide overlying substrate using water vapor (e.g., less than 750 degrees C.);

3. Introduce NO (or NO2) bearing species at pre-selected temperature to introduce nitrogen bearing species into the oxide layer;

4. Maintain layer to a pre-determined thickness of about less than 30 Angstroms, whereupon the thickness is substantially the same for different concentrations of nitrogen bearing species;

5. Perform rapid thermal oxidation on the nitrided layer to grow the layer to a final test layer thickness based upon the amount of nitrogen bearing species in the oxide layer;

6. Measure final test layer thickness using ellipsometer;

7. Perform nitrogen monitoring analysis using plot based upon a thickness difference between the pre-determined thickness and the final test layer thickness;

8. Determine concentration of nitrogen bearing species in the oxide layer;

9. Adjust process based upon the monitoring step, if necessary;

10. Perform steps again to determine concentration of nitrogen bearing species; and 11. Perform other steps, as desired.

The above sequence of steps is a method according to the present invention to determine a nitrogen bearing species concentration of the gate dielectric layer. Such sequence can be implanted on-line by simply introducing a test wafer into a production run. Processing the test wafer and then preparing the test wafer for measurement. Such preparation uses a rapid thermal oxidation process to grow the dielectric layer to a certain thickness based upon the concentration of nitrogen bearing species in the layer, which inhibits its growth. A thickness difference is measured and used to determine a concentration of nitrogen bearing species in the gate dielectric layer. Further details of this method are provided throughout the present specification and more particularly according to the Figures below.

The method also provides a way of forming correlation data between a thickness measurement and a nitrogen bearing species concentration. In a specific embodiment, the method for forming a correlation data according to an embodiment of the present invention can be provided as follows:

1. Provide semiconductor substrate;

2. Form gate oxide to predetermined thickness overlying substrate using water vapor (e.g., less than 750 degrees C.);

3. Introduce nitrogen oxide ("NO") (or nitrogen dioxide ("NO2")) bearing species to introduce nitrogen bearing species into the oxide layer;

4. Maintain layer to form first thickness based upon first anneal time period at predetermined temperature;

5. Measure thickness using ellipsometer (manufactured by Rudolph Instruments) and nitrogen concentration using SIMS analysis;

6. Repeat steps 1 through 5 for other thickness and anneal times based upon predetermined temperature, where the other thicknesses 2 through N for respective anneal times 2 through N, where N is an integer greater than 1;

7. Plot thickness distribution as a function of nitrogen concentration or as a function of anneal time; and 8. Perform other steps, as desired The above sequence of steps is used to prepare a correlation between concentrations of nitrogen bearing species in a dielectric layer to anneal times (or thicknesses). The correlation data will be used to determine a concentration of nitrogen bearing species in the gate dielectric layer. Further details of the present method can be found according to the Figure below.

Figure 3:
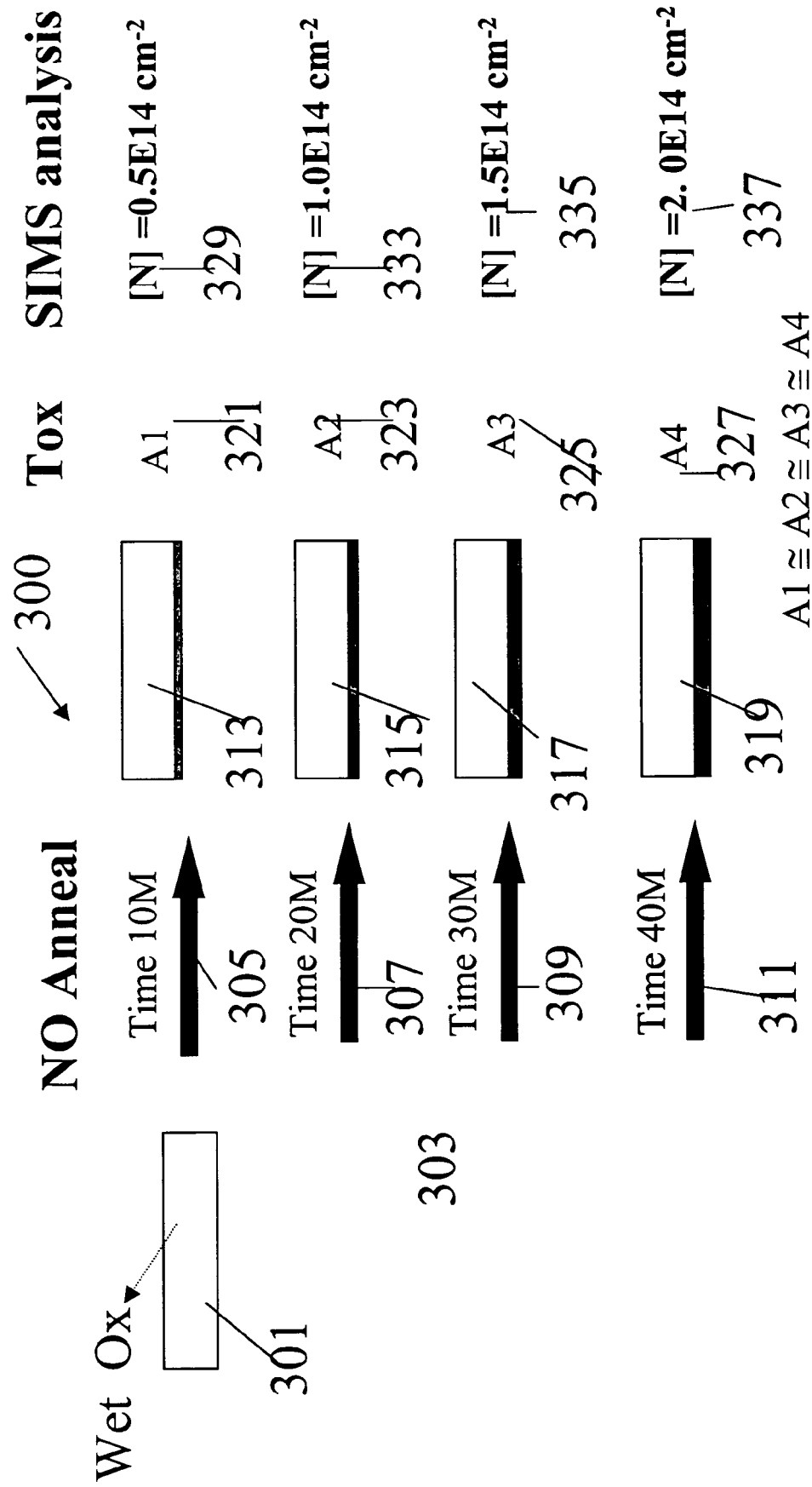
FIG. 3 is a simplified diagram of a monitoring method according to an embodiment of the present invention.

FIG. 3 is a simplified diagram of a monitoring method 300 according to an embodiment of the present invention. This diagram is merely an example, which should not unduly limit the scope of the claims herein. One of ordinary skill in the art would recognize many other variations, modifications, and alternatives. Initially, the method provides a semiconductor substrate, which has been prepared for gate oxidation formation. The method forms gate oxide to predetermined thickness overlying substrate using water vapor (e.g., less than 750 degrees C.) 301. The method also introduces introduce nitrogen oxide ("NO") (or nitrogen dioxide ("NO2")) bearing species to introduce nitrogen bearing species into the oxide layer. The layer is maintained for a first anneal time 305 to form a first thickness A1 321 based upon first anneal time period at predetermined temperature. Here, the thickness is measured using an ellipsometer such as those manufactured by Rudolph Instruments, but can be others. A nitrogen concentration is also determined using SIMS analysis. These steps are repeated for other anneal times (e.g., 307, 309, 311), which form other thicknesses (e.g., A2 323, A3 325, A4 327) and corresponding concentrations (e.g., 333, 335, 337).

Figure 4:
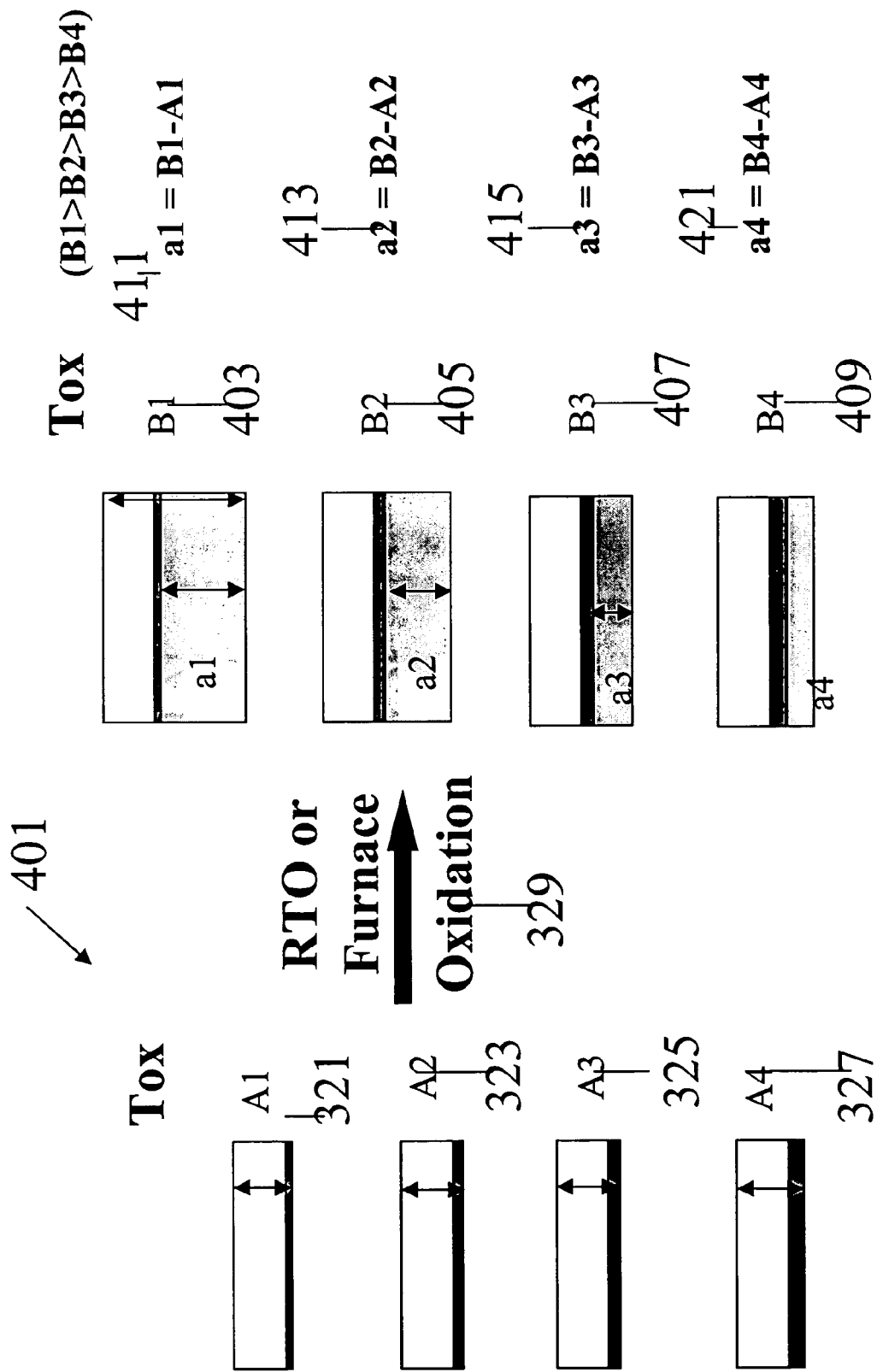
FIG. 4 is a simplified diagram of a monitoring method according to an embodiment of the present invention.

FIG. 4 is a simplified diagram of a monitoring method according to an embodiment of the present invention. This diagram is merely an example, which should not unduly limit the scope of the claims herein. One of ordinary skill in the art would recognize many other variations, modifications, and alternatives. Referring to FIG. 4, each of the substrates (A1 321, A2 232, A3 325, A4 327) is subjected to rapid thermal oxidation or furnace oxidation to grow oxide overlying the thickness of silicon oxynitride. Preferably, the rapid thermal oxidation or furnace oxidation process is the same for each of the substrates. The process is performed until each of the substrates forms an additional thickness of oxide a1, a2, a3, a4, which correspond to a total thickness B1 403, B2 405, B3 407, B4 409. For easier processing, total thickness is measured by the ellipsometer. Additional thicknesses a1, a2, a3, and a4 are determined by subtracting the total thickness from the initial thickness readings. As merely an example, I have provided the following relationship:

$$a1 = B1 - A1$$

where: a1 is a thickness of the oxidation film from the rapid thermal oxidation or furnace oxidation;

B1 is a total thickness of oxidation film and nitrided film; and

A1 is a total thickness of nitrided film.

Figure 5:
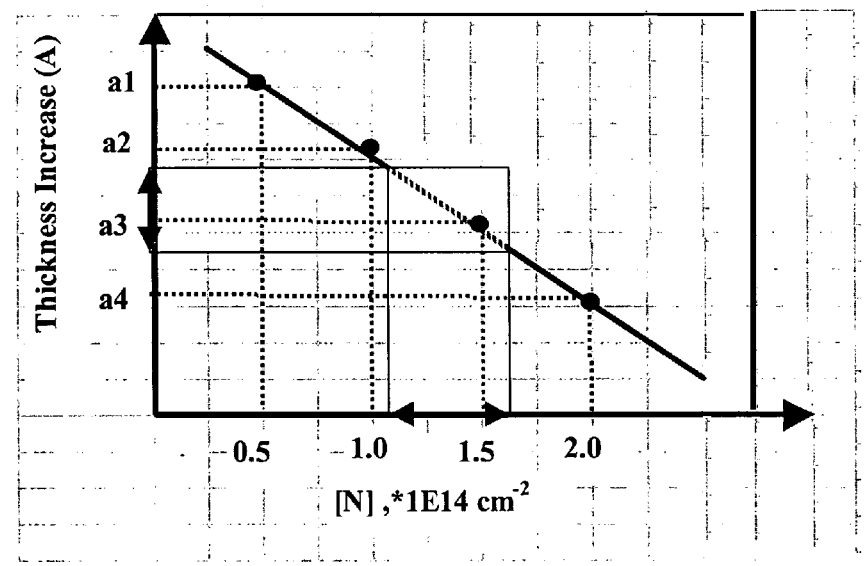
FIG. 5 is a simplified diagram of thickness plotted against nitrogen species concentration used in the method of FIG. 4 according to an embodiment of the present invention.

The method determines a1 411, a2 413, a3 415, and a4 421. Next the method plots the thickness of the oxidation film against respective concentration values, as illustrated by FIG. 5, which is a simplified diagram of thickness plotted against nitrogen species concentration used in the method of FIG. 4 according to an embodiment of the present invention. This diagram is merely an example, which should not unduly limit the scope of the claims herein. One of ordinary skill in the art would recognize many other variations, modifications, and alternatives. As shown, the vertical axis represents thickness in Angstroms and the horizontal axis, which intersects the vertical axis, represents concentration of nitrogen bearing species. The present diagram forms a way to correlate a thickness increase with a concentration profile, which is used according to the method described herein. That is, the method determines a thickness of the test wafer on the vertical axis, which is used to determine the concentration profile on the horizontal axis. The method then determines if the concentration of the nitrogen should be adjusted.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices, the method comprising:
   introducing a test wafer into a production run of wafers to form a run of wafers to be processed, each of the wafers being before a gate dielectric production process;
   inserting the run of wafers into a process for gate dielectric production;
   forming a silicon oxynitride layer to a first predetermined thickness of less than 40 Angstroms at a predetermined temperature using a nitrogen bearing species and an oxygen bearing species;
   removing the test wafer from the run;
   forming a second oxidation overlying the silicon oxynitride layer to a second thickness, the second thickness being based substantially upon a nitrogen bearing concentration in the silicon oxynitride layer;
   determining a difference value between the first predetermined thickness and the second thickness; and
   correlating the difference value to one of a plurality of nitrogen concentrations to determine a nitrogen concentration in the first predetermined thickness.

2. The method of claim 1 wherein the second oxidation is a rapid thermal oxidation process using oxygen bearing species.

3. The method of claim 2 wherein the second thickness is greater than the first predetermined thickness.

4. The method of claim 1 wherein the process is an in-line process with production run.

5. The method of claim 1 wherein the second oxidation is greater than about 900 degrees C. using an oxygen molecular species.

6. The method of claim 1 wherein the correlating is from a plot, the plot relating difference value to nitrogen concentrations.

7. The method of claim 1 wherein the determining is provided using at least an ellipsometer.

8. The method of claim 1 wherein the forming of silicon oxynitride comprises forming a silicon oxide layer overlying the wafers and introducing a nitrogen bearing species to form silicon oxynitride.

9. The method of claim 1 wherein the forming of silicon oxynitride layer comprises at least implanting nitrogen bearing species into a silicon dioxide layer overlying each of the wafers.

10. The method of claim 1 wherein the test wafer is a dummy wafer.

11. A method for processing integrated circuit memory devices, the method comprising:
   preparing a plurality of test wafers identifiable by numbers from 1 through N, where N is an integer greater than 1, each of the test wafers including a predetermined thickness of dielectric material overlying the test wafer, the predetermined thickness of dielectric material being substantially a same thickness for each of the test wafers;
   introducing a predetermined concentration of nitrogen bearing impurity from a plurality of different concentrations identifiable by numbers from 1 through N, where N is an integer greater than 1, into a respective test wafer identifiable by numbers 1 through N;
   repeating the introducing for other test wafers until all test wafers numbered from 1 through N and all predetermined concentrations numbered from 1 through N are respectively introduced into test wafers numbered from 1 through N;
   subjecting each of the test wafers to an oxidizing environment under selected conditions to cause growth to the dielectric layer on each of the test wafers, whereupon the growth is based for each test wafer based upon the predetermined concentration of nitrogen bearing impurity in the test wafer;
   measuring a thickness of the dielectric material for each of the test wafers 1 through N, the thickness of the dielectric material for each of the test wafers being identifiable by numbers from 1 through N; and
   correlating each of thickness numbered from 1 through N to each respective predetermined concentration numbered from 1 through N.

12. The method of claim 11 wherein the oxidizing environment is a rapid thermal oxidation process.

13. The method of claim 11 wherein N is at least 5.

14. The method of claim 11 wherein the correlation is a plot of thicknesses against concentrations.

15. The method of claim 11 wherein each of the test wafers is a silicon wafer of same characteristics.

16. A method for processing integrated circuit devices, the method comprising:
   introducing a test wafer into a process for gate dielectric formation;
   forming a silicon oxynitride layer to a predetermined thickness of less than 40 Angstroms at a predetermined temperature using a nitrogen bearing species on the test wafer;
   forming a second oxidation overlying the silicon oxynitride layer to form an oxidation layer of a second thickness, the second thickness being based substantially upon a nitrogen bearing concentration of the nitrogen bearing species in the silicon oxynitride layer;
   determining a parameter based upon at least the second thickness; and
   using the parameter to determine a concentration of the nitrogen bearing species in the silicon oxynitride layer.

17. The method of claim 11 wherein the parameter is a thickness of the second thickness.

18. The method of claim 11 wherein the test wafer is included in a production run of wafers.

19. The method of claim 18 wherein the test wafer and the production run of wafers are provided into the process for gate dielectric formation.

20. The method of claim 19 wherein the test wafer is provided for an in-line test process, the in-line test process being substantially free from interference with the production run.

* * * * *